United States Patent
Wu (10) Patent No.: US 10,700,516 B2
(45) Date of Patent: Jun. 30, 2020

(54) ELECTROSTATIC DISCHARGE PROTECTION CIRCUIT

(71) Applicant: REALTEK SEMICONDUCTOR CORPORATION, Hsinchu (TW)

(72) Inventor: Chien-Ming Wu, Hsinchu County (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 174 days.

(21) Appl. No.: 15/894,269

(22) Filed: Feb. 12, 2018

(65) Prior Publication Data
US 2018/0248366 A1 Aug. 30, 2018

(30) Foreign Application Priority Data
Feb. 24, 2017 (TW) .............................. 106106561 A (51) Int. Cl.
H02H 9/04 (2006.01)
H02H 1/00 (2006.01)
H01L 27/02 (2006.01)

(52) U.S. Cl.
CPC ......... *H02H 9/046* (2013.01); *H01L 27/0285* (2013.01); *H02H 1/0007* (2013.01)

(58) Field of Classification Search
CPC .......... H02H 9/04; H02H 9/041; H02H 9/046; H02H 1/0007; H01L 27/0248–0296
See application file for complete search history.

(56) References Cited

U.S. PATENT DOCUMENTS 6,011,681 A * 1/2000 Ker ..................... H01L 27/0251
                                                  361/111
6,249,410 B1 * 6/2001 Ker ..................... H01L 27/0251
                                                  361/111

(Continued)

FOREIGN PATENT DOCUMENTS

CN        104979814 A        10/2015

OTHER PUBLICATIONS

OA letter of the counterpart CN application (appl. No. 201710169712.X) dated Mar. 12, 2019. Summary of the CN OA letter: Claims 1-4, 7, 8, 10 are rejected as being unpatentable over the cited reference 1 (CN104979814A; also published as US9876003B2) and common knowledge.

(Continued)

*Primary Examiner* — Thienvu V Tran
*Assistant Examiner* — Christopher J Clark
(74) *Attorney, Agent, or Firm* — WPAT, PC (57) ABSTRACT

The present invention discloses an electrostatic discharge (ESD) protection circuit including: a first terminal configured to provide a first voltage having a first value in a normal mode; a second terminal configured to provide a second voltage having a second value in the normal mode; a detection circuit configured to provide a detection voltage according to the first and second voltages; and a protection circuit configured to operate in one of the normal mode and an ESD mode according to the detection voltage. When the difference between a value of the detection voltage and an average of the first and second values reaches a predetermined threshold, the protection circuit enters the ESD mode from the normal mode, and thereby has a first path between the first terminal and a grounding terminal and/or a second path between the second terminal and the grounding terminal be conductive for discharging abnormal energy.

16 Claims, 9 Drawing Sheets

(56) References Cited

U.S. PATENT DOCUMENTS

| | | | |
|---|---|---|---|
| 6,473,282 B1* | 10/2002 | Lin | H01L 27/0251 |
| | | | 327/543 |
| 7,529,070 B2* | 5/2009 | Bhattacharya | H01L 27/0266 |
| | | | 361/111 |
| 8,064,175 B2* | 11/2011 | Poulton | H01L 27/0285 |
| | | | 361/56 |
| 9,437,591 B1* | 9/2016 | Nidhi | H01L 27/0262 |
| 9,608,616 B1* | 3/2017 | Tsai | H03K 17/08142 |
| 9,876,003 B2 | 1/2018 | Chen et al. | |
| 10,177,137 B1* | 1/2019 | Altolaguirre | H01L 27/0285 |
| 2007/0103825 A1* | 5/2007 | Ker | H01L 27/0266 |
| | | | 361/56 |
| 2007/0230073 A1* | 10/2007 | Ker | H01L 27/0285 |
| | | | 361/56 |
| 2011/0317319 A1* | 12/2011 | Wu | H02H 1/04 |
| | | | 361/56 |
| 2013/0050885 A1* | 2/2013 | Chen | H02H 9/04 |
| | | | 361/56 |
| 2013/0155554 A1* | 6/2013 | Wang | H02H 9/046 |
| | | | 361/56 |
| 2014/0092507 A1 | 4/2014 | Lefferts et al. | |
| 2015/0288172 A1* | 10/2015 | Yeh | H02H 9/046 |
| | | | 361/56 |
| 2015/0288173 A1* | 10/2015 | Chen | H01L 27/0248 |
| | | | 361/56 |
| 2016/0172350 A1* | 6/2016 | Dey | H01L 29/78 |
| | | | 361/56 |
| 2017/0324239 A1* | 11/2017 | Tsaur | H01L 27/0285 |
| 2018/0212422 A1* | 7/2018 | Wu | H02H 9/04 |
| 2018/0301898 A1* | 10/2018 | Hsu | H02H 9/046 |

OTHER PUBLICATIONS

Chien-Ming Wu et al. "Electrostatic discharge protection circuit" U.S. Appl. No. 15/878,817, filed Jan. 24, 2018.

Yan Han et al., "Advanced Simulation for ESD Protection Elements," chapter 10 of "Advances in Solid State Circuit Technologies," Edited by Paul K Chu, ISBN 978-953-307-086-5, 446 pages, Publisher: InTech, Chapters published Apr. 1, 2010.

* cited by examiner

ELECTROSTATIC DISCHARGE PROTECTION CIRCUIT

BACKGROUND OF THE INVENTION

1. Field of the Invention

The present invention relates to a protection circuit, especially to an ESD protection circuit.

2. Description of Related Art

A conventional electrostatic discharge (ESD) protection circuit is configured to detect the voltages of power supply terminals (e.g., high voltage supply terminal $V_{DD}$ and low voltage supply terminal $V_{SS}$) or detect the voltages of the power supply terminals and the voltage of a grounding terminal, so as to enable a protection function according to the result of detection. The conventional ESD protection circuit usually includes one or more diode(s), and discharges abnormal energy to the grounding terminal through a discharge path via the power supply terminal(s). Since the diode(s) will cause circuit impedance (e.g., impedance at an input/output terminal) to increase and the discharge path via the power supply terminal(s) is usually lengthy and unfavorable for instant discharge, the conventional ESD protection circuit still needs to be improved.

People who are interested in the conventional art may refer to the following literature: "Advances in Solid State Circuit Technologies", Chapter 10.

SUMMARY OF THE INVENTION

In view of the problems of the prior art, an object of the present invention is to provide an electrostatic discharge (ESD) protection circuit capable of discharging abnormal energy instantly.

The present invention discloses an ESD protection circuit. An embodiment of the ESD protection circuit includes a first terminal, a second terminal, a detection circuit and a protection circuit. The first terminal is configured to provide a first voltage having a first value in a normal mode. The second terminal is configured to provide a second voltage having a second value in the normal mode. The detection circuit is coupled between the first terminal and the second terminal, and configured to provide a detection voltage according to the first voltage and the second voltage. The protection circuit is coupled to the detection circuit, coupled between the first terminal and a grounding terminal, and coupled between the second terminal and the grounding terminal, and the protection circuit is configured to operate in one of the normal mode and an ESD mode according to the detection voltage, wherein when a difference between a value of the detection voltage and an average of the first value and the second value reaches a predetermined threshold or when a difference between the value of the detection voltage and a reference value derived from the first value and the second value reaches the predetermined threshold, the protection circuit enters the ESD mode from the normal mode, and thereby changes a state of a first path between the first terminal and the grounding terminal from nonconductive to conductive and/or changes a state of a second path between the second terminal and the grounding terminal from nonconductive to conductive.

These and other objectives of the present invention will no doubt become obvious to those of ordinary skill in the art after reading the following detailed description of the exemplary embodiments that are illustrated in the various figures and drawings.

BRIEF DESCRIPTION OF THE DRAWINGS

FIG. 2 shows an exemplary implementation of the detection circuit of FIG. 1a.

FIG. 3 shows another exemplary implementation of the detection circuit of FIG. 1a.

FIG. 5 shows a further exemplary implementation of the detection circuit of FIG. 1a.

FIG. 7 shows an exemplary implementation of the protection circuit of FIG. 1a.

FIG. 8 shows another exemplary implementation of the protection circuit of FIG. 1a.

DETAILED DESCRIPTION OF THE PREFERRED EMBODIMENTS

The following description is written by referring to terms acknowledged in this industrial filed. If any term is defined in the description, such term should be explained accordingly.

The present invention discloses an electrostatic discharge (ESD) protection circuit capable of using no or less diode(s) so as to decrease the influence on impedance caused by the usage of diodes; furthermore, the ESD protection circuit also has a shortened discharge path for discharging abnormal energy more quickly. The present invention can be applied to a variety of circuits such as an Ethernet network circuit or any circuit requiring ESD protection, and is suitable for a circuit using a differential signal; however, the application of the present invention is not limited to the above-mentioned instances.

Figure 1A:
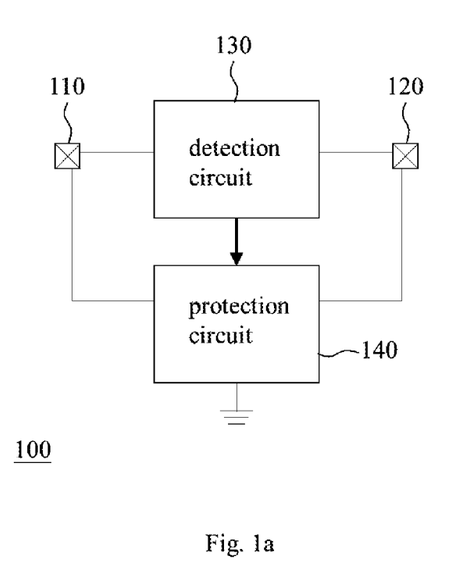
FIG. 1a shows a functional block diagram according to an embodiment of the ESD protection circuit of the present invention.
Figure 1B:
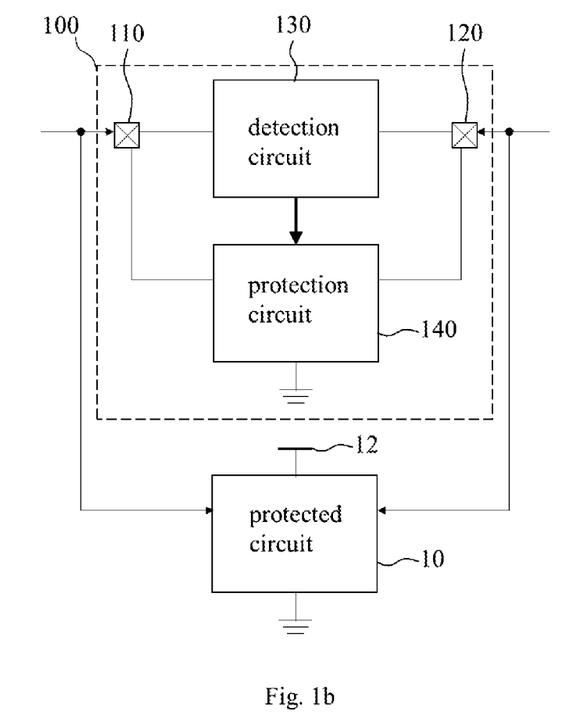
FIG. 1b shows the ESD protection circuit of the present invention for protecting a protected circuit.

Please refer to FIG. 1a which shows a functional block diagram according to an embodiment of the ESD protection circuit of the present invention. As shown in FIG. 1a, the ESD protection circuit 100 includes a first terminal 110, a second terminal 120, a detection circuit 130 and a protection circuit 140, and is capable of operating in a normal mode or an ESD mode. An instance of the normal mode is a mode without any significant ESD event, and an instance of the ESD mode is a mode with a significant ESD event. In addition to the circuits as shown in FIG. 1a, a protected circuit 10 could be coupled between the first terminal 110 and the second terminal 120 to be protected by the ESD protection circuit 100 as shown in FIG. 1b. In an exemplary implementation, the protected circuit 10 is coupled between a power supply terminal 12 and a grounding terminal. It should be noted that the term "terminal" in this specification should be interpreted as an electric terminal, a point, a node, a tap, an end or the like of the ESD protection circuit 100.

Please refer to FIG. 1a. The first terminal 110 is configured to provide a first voltage having a first value in the normal mode. Provided the ESD protection circuit 100 is applied to a circuit/device using a differential signal, the first terminal 110 is configured to receive a positive input of the differential signal while the first voltage is the direct-current (DC) level of the positive input. The second terminal 120 is configured to provide a second voltage having a second value in the normal mode. Provided the ESD protection circuit 100 is applied to a circuit/device using a differential signal, the second terminal 120 is configured to receive a negative input of the differential signal while the second voltage is the DC level of the negative input. The detection circuit 130 is coupled between the first terminal 110 and the second terminal 120, and configured to provide a detection voltage according to the first voltage and the second voltage. The detection voltage is between zero and the sum of the first voltage and the second voltage (i.e., 0≤the detection voltage≤the sum). The protection circuit 140 is coupled to the detection circuit 130, coupled between the first terminal 110 and a grounding terminal, and coupled between the second terminal 120 and the grounding terminal. The protection circuit 140 is configured to operate in one of the normal mode and the ESD mode according to the detection voltage. When the first terminal 110 and/or the second terminal 120 receive(s) abnormal voltage (e.g., surge voltage), the first voltage and/or the second voltage will rise up violently, and consequently the detection voltage will rise up correspondingly. If the difference between a value of the detection voltage and an average of the first value and the second value reaches a predetermined threshold or the difference between the value of the detection voltage and a reference value derived from the first value and the second value reaches the predetermined threshold, the protection circuit 140 enters the ESD mode from the normal mode and thereby has a first path between the first terminal 110 and the grounding terminal and/or a second path between the second terminal 120 and the grounding terminal change from non-conductive to conductive for discharging abnormal energy. The said predetermined threshold is dependent on the design of the protection circuit 140 and the said reference value is dependent on the design of the detection circuit 130, which will be further explained in the following paragraphs. It should be noted that in this embodiment, the first path and the second path may not include (or pass through) a power supply terminal (e.g., a high voltage terminal $V_{DD}$); however, this is not a limitation to the implementation of the present invention. People of ordinary skill in the art can design a discharge path passing through a power supply terminal according to the disclosure of the present invention in view of their demand.

Figure 2:
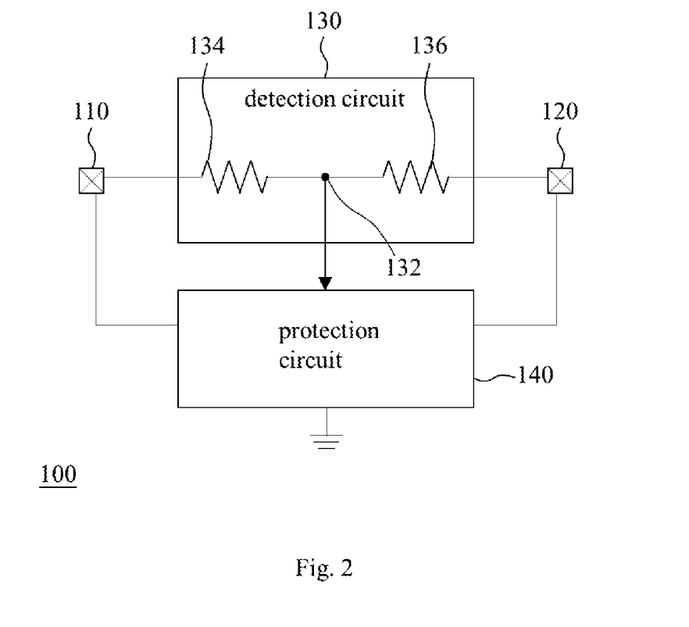

Please refer to FIG. 2 which shows an exemplary implementation of the detection circuit 130 of FIG. 1a. As shown in FIG. 2, the detection circuit 130 includes: a detection voltage output terminal 132 coupled to the protection circuit 140 and configured to output the detection voltage; a first resistor 134 coupled between the first terminal 110 and the detection voltage output terminal 132; and a second resistor 136 coupled between the second terminal 120 and the detection voltage output terminal 132. In this exemplary implementation, the resistance of the first resistor 134 is substantially equal to the resistance of the second resistor 136, so that the value of the detection voltage will be substantially equal to the average of the aforementioned first value and the aforementioned second value in the normal mode. In other words, provided the protection circuit 100 is applied to a circuit/device using a differential signal, the detection voltage is equal to a common mode voltage in the normal mode. However, in another exemplary implementation, the resistance of the first resistor 134 and the resistance of the second resistor 136 are different (while the value of the detection voltage is equal to the aforementioned reference value), so that the ESD event at the first terminal 110 will be held true in a condition different from that of the second terminal 120 as long as the aforementioned first path and the aforementioned second path are equivalent, or the ESD event at the first terminal 110 will be held true in a condition similar to that of the second terminal 120 provided the difference between the first path and the second path compensates for the difference between the first resistor 134 and the second resistor 136. Such kinds of modifications are in the scope of the present invention.

Figure 3:
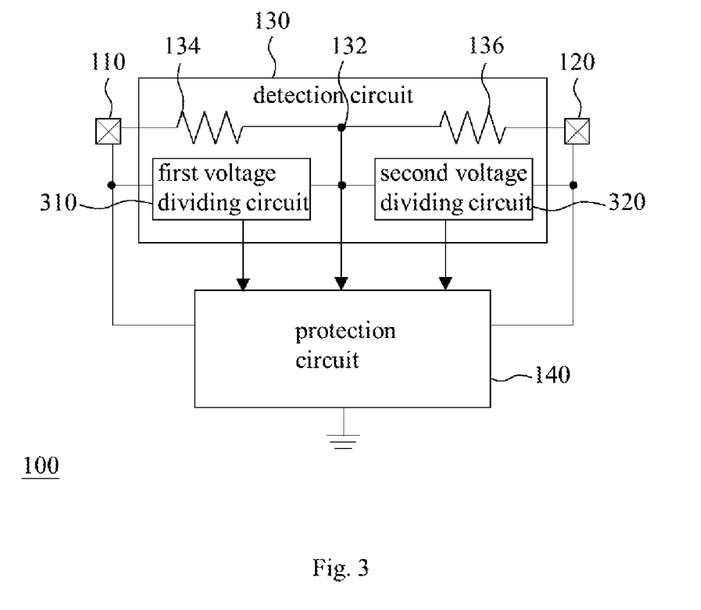
Figure 4:
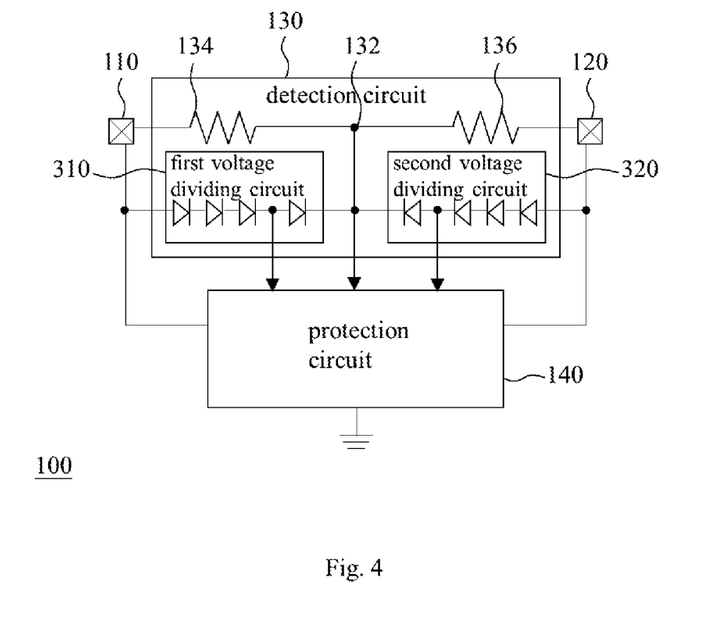
FIG. 4 shows an exemplary implementation of the first and the second voltage dividing circuits of FIG. 3.

Please refer to FIG. 3 which shows another exemplary implementation of the detection circuit 130 of FIG. 1a. In comparison with FIG. 2, the detection circuit 130 of FIG. 3 further includes: a first voltage dividing circuit 310 coupled between the first terminal 110 and the detection voltage output terminal 132 and configured to supply a first division voltage to the protection circuit 140 according to the first voltage and the second voltage, in which the first division voltage is different from the detection voltage; and a second voltage dividing circuit 320 coupled between the second terminal 120 and the detection voltage output terminal 132 and configured to supply a second division voltage to the protection circuit 140 according to the first voltage and the second voltage, in which the second division voltage is different from the detection voltage, and the first division voltage and the second division voltage correlate with the aforementioned predetermined threshold. For instance, as shown in FIG. 4, the first voltage dividing circuit 310 includes N diodes (N=4 in FIG. 4), and the first division voltage is the voltage at a node between the $M^{th}$ one (M=3 in FIG. 4) of the N diodes from one end and the $(N-M)^{th}$ one of the N diodes from the other end. Since the second voltage dividing circuit 320 is similar to the first voltage dividing circuit 310, the second division voltage is determined in the same way. In addition, the lower the first division voltage (i.e., the larger the M) in relation to the detection voltage, the higher the predetermined threshold; similarly, the lower the second division voltage in relation to the detection voltage, the higher the predetermined threshold. For another instance, the diodes in FIG. 4 are replaced with other impedance components (e.g., resistors).

Figure 5:
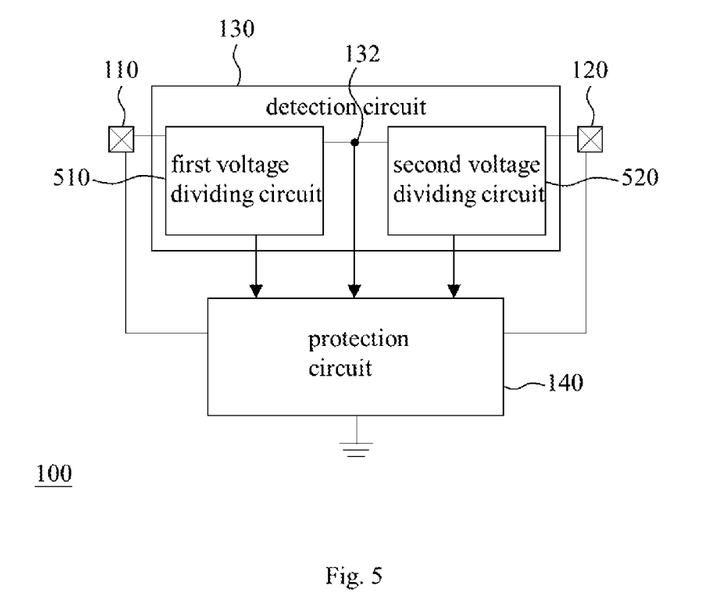

Please refer to FIG. 5 which shows a further exemplary implementation of the detection circuit 130 of FIG. 1a. As shown in FIG. 5, the detection circuit 130 includes: a detection voltage output terminal 132 coupled to the protection circuit 140 and configured to output the detection voltage; a first voltage dividing circuit 510 coupled between the first terminal 110 and the detection voltage output terminal 132 and configured to supply a first division voltage to the protection circuit 140 according to the first voltage and the second voltage, in which the first division voltage is different from the detection voltage; and a second voltage dividing circuit 520 coupled between the second terminal 120 and the detection voltage output terminal 132 and configured to supply a second division voltage to the protection circuit 140 according to the first voltage and the second voltage, in which the second division voltage is different from the detection voltage, and the first division voltage and the second division voltage correlate with the predetermined threshold. In this exemplary implementation, the lower the first division voltage in relation to the detection voltage, the higher the predetermined threshold; similarly, the lower the second division voltage in relation to the detection voltage, the higher the predetermined threshold.

Figure 6:
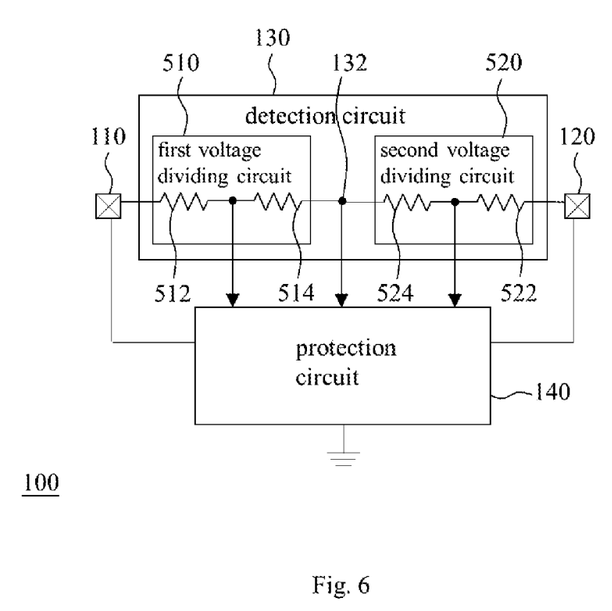
FIG. 6 shows an exemplary implementation of the first and the second voltage dividing circuits of FIG. 5.

Please refer to FIG. 6 which shows an exemplary implementation of the first voltage dividing circuit 510 and the second voltage dividing circuit 520 of FIG. 5. As shown in FIG. 6, the first voltage dividing circuit 510 includes a resistor 512 and a resistor 514, and the first division voltage is the voltage at a node between the resistor 512 and the resistor 514; the second voltage dividing circuit 520 includes a resistor 522 and a resistor 524, and the second division voltage is the voltage at a node between the resistor 522 and the resistor 524. In this exemplary implementation, the sum of resistance of the resistor 512 and the resistor 514 is equal to the sum of the resistance of the resistor 522 and the resistor 524; more specifically, the resistor 512 is equivalent to the resistor 522 and the resistor 514 is equivalent to the resistor 524, so that the value of the detection voltage is equal to the average of the first value of the first voltage and the second value of the second voltage in the normal mode. In other words, provided the ESD protection circuit 100 is applied to a circuit/device using a differential signal, the detection voltage will be equal to a common mode voltage in the normal mode. However, in another exemplary implementation, the sum of resistance of the resistor 512 and the resistor 514 is different from the sum of resistance of the resistor 522 and the resistor 524 (while the value of the detection voltage is equal to the aforementioned reference value), so that the ESD event at the first terminal 110 is confirmed in a condition different from that of the second terminal 120 as long as the aforementioned first and second paths are equivalent, or the ESD event at the first terminal 110 is confirmed in a condition the same as that of the second terminal 120 provided the difference between the first path and the second path compensates for the difference between the first voltage dividing circuit 510 and the second voltage dividing circuit 520. Such kinds of modifications are in the scope of the present invention.

Figure 7:
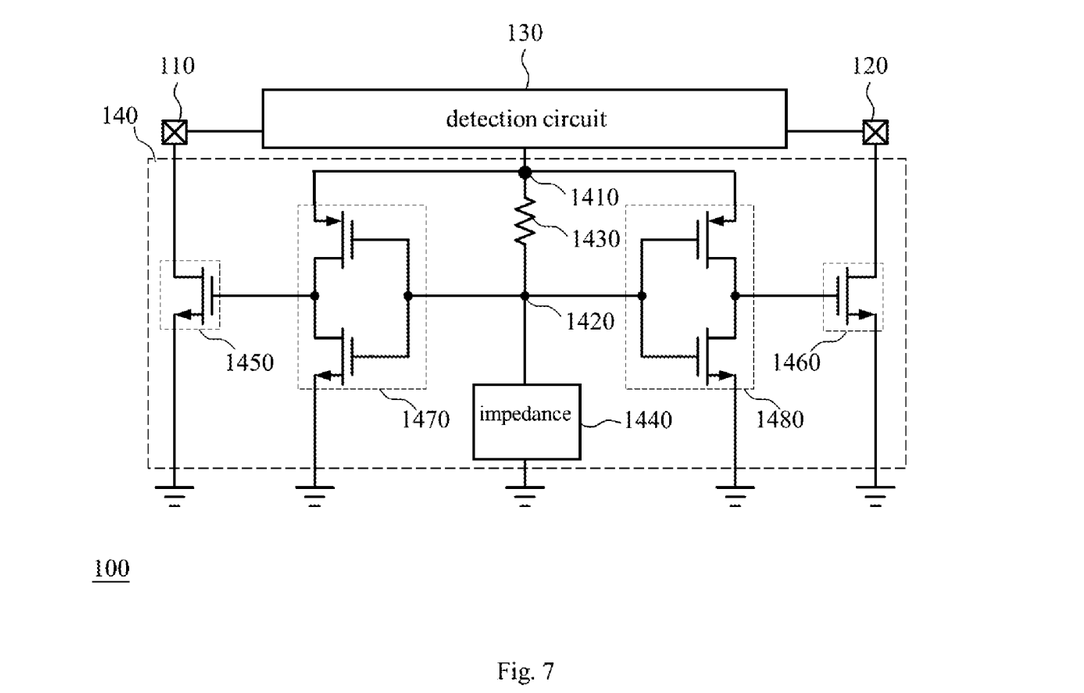

Please refer to FIG. 7 which shows an embodiment of the protection circuit 140 of FIG. 1a. As shown in FIG. 7, the protection circuit 140 includes: a detection voltage input terminal 1410 coupled to the detection circuit 130 and configured to receive the detection voltage; a control voltage output terminal 1420 configured to output a control voltage; a resistor 1430 coupled between the detection voltage input terminal 1410 and the control voltage output terminal 1420; an impedance 1440 coupled between the resistor 1430 and the aforementioned grounding terminal; a first switch 1450 coupled between the first terminal 110 and the grounding terminal; a second switch 1460 coupled between the second terminal 120 and the grounding terminal; a first control unit 1470 coupled between the control voltage output terminal 1420 and the first switch 1450 and configured to turn on or turn off the first switch 1450 according to the control voltage; and a second control unit 1480 coupled between the control voltage output terminal 1420 and the second switch 1460 and configured to turn on or turn off the second switch 1460 according to the control voltage.

Please refer to FIG. 7 again. In this exemplary implementation, the impedance 1440 includes a capacitor and/or a resistor which affects the control voltage in conjunction with the detection voltage and the resistor 1430. For instance, provided the impedance 1440 is a capacitor, in the normal mode the control voltage will be equal to the detection voltage after fully charging the capacitor; it should be noted that the difference between the detection voltage and the control voltage is equivalent to the aforementioned "difference between the value of the detection voltage and the average of the first value and the second value" or "difference between the value of the detection voltage and a reference value derived from the first value and the second value". In addition, in this exemplary implementation, each of the first control unit 1470 and the second control unit 1480 is an inverter; however, this is not a limitation to the present invention; any control unit capable of entering the ESD mode when any of the above-mentioned difference(s) reaches the predetermined threshold can replace the first control unit 1470 and/or the second control unit 1480.

Please refer to FIG. 7 again. Provided both the first control unit 1470 and the second control unit 1480 are coupled between the detection voltage input terminal 1410 and the grounding terminal (i.e., the detection circuit 130 including no voltage dividing circuits), the first control unit 1470 is configured to have a first low voltage output path between a first control terminal (e.g., the gate of an NMOS) of the first switch 1450 (e.g., an NMOS) and the grounding terminal be conductive or nonconductive according to the control voltage (while the first low voltage output path can be understood as a path from the first control terminal to the grounding terminal via the first control unit 1470), and the first control unit 1470 is also configured to have a first high voltage output path between the first control terminal of the first switch 1450 and the detection voltage input terminal 1410 be conductive or nonconductive according to the control voltage and the detection voltage (while the first high voltage output path can be understood as a path from the first control terminal to the detection voltage input terminal 1410 via the first control unit 1470). For instance, when the first terminal 110 receives surge voltage, the detection voltage will rise up violently while the control voltage will rise up at a relatively slower speed, so that the gate-to-source voltage $V_{GS}$ of a PMOS of the first control unit 1470 will change from positive voltage to negative voltage and thereby allow the first high voltage output path to be conductive. Similarly, the second control unit 1480 is configured to have a second low voltage output path between a second control terminal of the second switch 1460 and the grounding terminal be conductive or nonconductive according to the control voltage (while the second low voltage output path can be understood as a path from the second control terminal to the grounding terminal via the second control unit 1480), and the second control unit 1480 is also configured to have a second high voltage output path between the second control terminal of the second switch 1460 and the detection voltage input terminal 1410 be conductive or nonconductive according to the control voltage and the detection voltage (while the second high voltage output path can be understood as a path from the second control terminal to the detection voltage input terminal 1410 via the second control unit 1480). For instance, when the second terminal 120 receives surge voltage, the detection voltage will rise up violently while the control voltage will rise up at a relatively slower speed, so that the gate-to-source voltage $V_{GS}$ of a PMOS of the second control unit 1480 will change from positive voltage to negative voltage and thereby allow the second high voltage output path to be conductive. When the first and the second low voltage output paths are conductive, the first control unit 1470 and the second control unit 1480 turn off the first switch 1450 and the second switch 1460 respectively (because the voltages at the first and second control terminals are equivalent/similar to the voltage at the grounding terminal); meanwhile, the ESD protection circuit 100 is in the normal mode. When the first and the second high voltage output paths are conductive, the first control unit 1470 and the second control unit 1480 turn on the first switch 1450 and the second switch 1460 respectively (because the voltages at the first and second control terminals are close to the voltage at the detection voltage input terminal 1410); meanwhile, the ESD protection circuit 100 is in the ESD mode.

Figure 8:
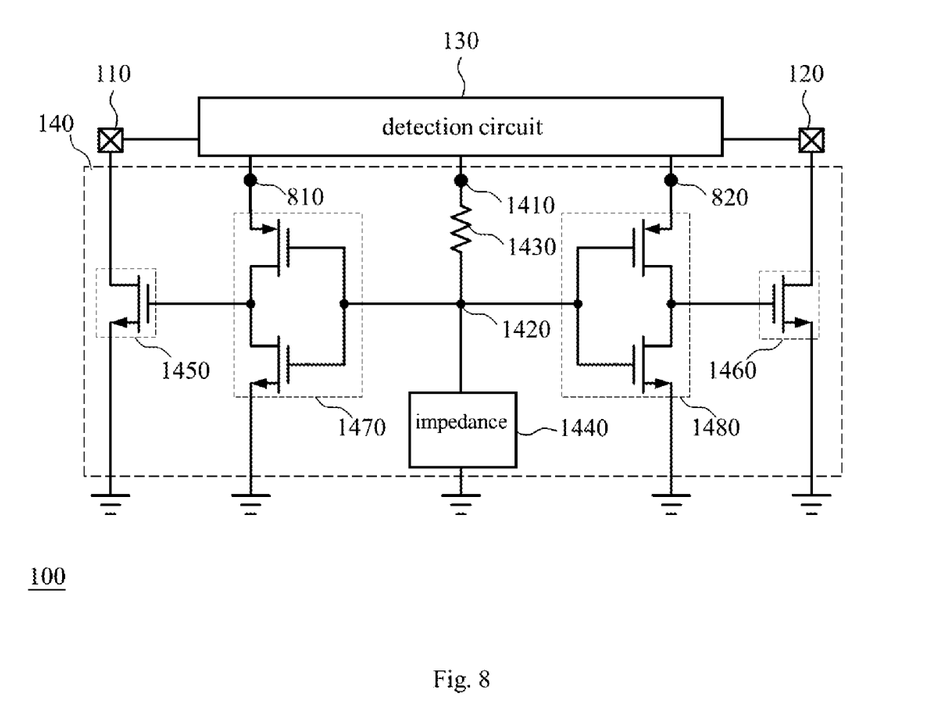

Please refer to FIG. 8. Provided each of the first control unit 1470 and the second control unit 1480 is coupled between an division voltage input terminal and the grounding terminal (i.e., the detection circuit 130 including one or more voltage dividing circuit(s)), the protection circuit 140 of FIG. 8 further includes: a first division voltage input terminal 810 configured to receive a first division voltage from the detection circuit 130, in which the first division voltage is originated from the first voltage and the second voltage and different from the detection voltage; and a second division voltage input terminal 820 configured to receive a second division voltage from the detection circuit 130, in which the second division voltage is originated from the first voltage and the second voltage and different from the detection voltage. In addition, the first control unit 1470 is coupled between the first division voltage input terminal 810 and the grounding terminal; the first control unit 1470 is configured to have a first low voltage output path between a first control terminal of the first switch 1450 and the grounding terminal be conductive or nonconductive according to the control voltage, in which the first low voltage output path can be understood as a path from the first control terminal to the grounding terminal via the first control unit 1470; the first control unit 1470 is also configured to have a first high voltage output path between the first control terminal and the first division voltage input terminal 810 be conductive or nonconductive according to the control voltage and the first division voltage, in which the first high voltage output path can be understood as a path from the first control terminal to the first division voltage input terminal 810 through the first control unit 1470. Similarly, the second control unit 1480 is coupled between the second division voltage input terminal 820 and the grounding terminal; the second control unit 1480 is configured to have a second low voltage output path between a second control terminal of the second switch 1460 and the grounding terminal be conductive or nonconductive according to the control voltage, in which the second low voltage output path can be understood as a path from the second control terminal to the grounding terminal through the second control unit 1480; the second control unit 1480 is also configured to have a second high voltage output path between the second control terminal of the second switch 1460 and the second division voltage input terminal 820 be conductive or nonconductive according to the control voltage and the second division voltage, in which the second high voltage output path can be understood as a path from the second control terminal to the second division voltage input terminal 820 via the second control unit 1480. When the first and the second low voltage output paths are conductive, the first control unit 1470 and the second control unit 1480 turn off the first switch 1450 and the second switch 1460 respectively; meanwhile, the ESD protection circuit 100 is in the normal mode. When the first and the second high voltage output paths are conductive, the first control unit 1470 and the second control unit 1480 turn on the first switch 1450 and the second switch 1460 respectively; meanwhile, the ESD protection circuit 100 is in the ESD mode.

Regarding the embodiments of FIG. 7 and FIG. 8, the first switch 1450 includes an NMOS transistor including a parasitic diode which acts as an energy discharge path when the grounding terminal receives surge voltage; similarly, the second switch 1460 includes an NMOS transistor including a parasitic diode which acts as an energy discharge path when the grounding terminal receives surge voltage. Of course people of ordinary skill in the art can use other known/self-developed switch components as the first switch 1450 and the second switch 1460. In addition, provided the aforementioned first control unit 1470 and the second control unit 1480 are inverters, those of ordinary skill in the art can appreciate that the characteristic curves (i.e., the requirements for operation/conduction) of the inverters can be controlled through many kinds of known means (e.g., through appropriate dopant which affects the gate-to-source voltage $V_{GS}$ of a MOS); in other words, the aforementioned predetermined threshold can be controlled by the those means. Of course people of ordinary skill in the art can use other known/self-developed control components as the first control unit 1470 and the second control unit 1480.

Since those of ordinary skill in the art can appreciate the detail and the modification of one embodiment by referring to the description of the other embodiments, which means that the features of each embodiment can be applied to any of the other embodiments in a reasonable way, repeated and redundant explanation is omitted.

To sum up, the present invention can use no or less non-parasitic diode(s) (e.g., diode-connected MOS) to reduce the influence on impedance caused by the usage of diodes, and can discharge abnormal energy more quickly with the design of a shortened discharge path.

The aforementioned descriptions represent merely the exemplary embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An electrostatic discharge (ESD) protection circuit, comprising:
   a first terminal configured to provide a first voltage having a first value in a normal mode, wherein the first terminal is configured to receive a first input of a differential signal and the first voltage is a direct-current (DC) level of the first input;
   a second terminal configured to provide a second voltage having a second value in the normal mode, wherein the second terminal is configured to receive a second input of the differential signal and the second voltage is a DC level of the second input;
   a detection circuit coupled between the first terminal and the second terminal, and configured to provide a detection voltage according to the first voltage and the second voltage; and
   a protection circuit coupled to the detection circuit, coupled between the first terminal and a grounding terminal, and coupled between the second terminal and the grounding terminal, and the protection circuit configured to operate in one of the normal mode and an ESD mode according to the detection voltage,
   wherein when one of a first difference and a second difference reaches a predetermined threshold, the protection circuit enters the ESD mode from the normal mode, and thereby changes a state of a first path between the first terminal and the grounding terminal from nonconductive to conductive and/or changes a state of a second path between the second terminal and the grounding terminal from nonconductive to conductive; and
   wherein the first difference is between a value of the detection voltage and an average of the first value and the second value and the second difference is between the value of the detection voltage and a reference value derived from the first value and the second value.

2. The ESD protection circuit of claim 1, wherein the value of the detection voltage is equal to the average of the first value and the second value in the normal mode.

3. The ESD protection circuit of claim 2, wherein the detection circuit includes:
- a detection voltage output terminal coupled to the protection circuit and configured to output the detection voltage;
- a first resistor coupled between the first terminal and the detection voltage output terminal; and
- a second resistor coupled between the second terminal and the detection voltage output terminal.

4. The ESD protection circuit of claim 3, wherein the detection circuit further includes:
- a first voltage dividing circuit coupled between the first terminal and the detection voltage output terminal and configured to supply a first division voltage to the protection circuit according to the first voltage and the second voltage, in which the first division voltage is different from the detection voltage; and
- a second voltage dividing circuit coupled between the second terminal and the detection voltage output terminal and configured to supply a second division voltage to the protection circuit according to the first voltage and the second voltage, in which the second division voltage is different from the detection voltage, and the first division voltage and the second division voltage correlate with the predetermined threshold.

5. The ESD protection circuit of claim 2, wherein the detection circuit includes:
- a detection voltage output terminal coupled to the protection circuit and configured to output the detection voltage;
- a first voltage dividing circuit coupled between the first terminal and the detection voltage output terminal and configured to supply a first division voltage to the protection circuit according to the first voltage and the second voltage, in which the first division voltage is different from the detection voltage; and
- a second voltage dividing circuit coupled between the second terminal and the detection voltage output terminal and configured to supply a second division voltage to the protection circuit according to the first voltage and the second voltage, in which the second division voltage is different from the detection voltage, and the first division voltage and the second division voltage correlate with the predetermined threshold.

6. The ESD protection circuit of claim 2, wherein the protection circuit includes:
- a detection voltage input terminal coupled to the detection circuit and configured to receive the detection voltage;
- a control voltage output terminal configured to output a control voltage;
- a resistor coupled between the detection voltage input terminal and the control voltage output terminal;
- an impedance coupled between the resistor and the grounding terminal;
- a first switch coupled between the first terminal and the grounding terminal;
- a second switch coupled between the second terminal and the grounding terminal;
- a first control unit coupled between the control voltage output terminal and the first switch and configured to turn on or turn off the first switch according to the control voltage; and
- a second control unit coupled between the control voltage output terminal and the second switch and configured to turn on or turn off the second switch according to the control voltage.

7. The ESD protection circuit of claim 6, wherein the first control unit is coupled between the detection voltage input terminal and the grounding terminal, the first control unit is configured to have a first low voltage output path between a first control terminal of the first switch and the grounding terminal be conductive or nonconductive according to the control voltage, the first control unit is configured to have a first high voltage output path between the first control terminal and the detection voltage input terminal be conductive or nonconductive according to the control voltage and the detection voltage, and the first control unit turns on the first switch when the first high voltage output path is conductive; the second control unit is coupled between the detection voltage input terminal and the grounding terminal, the second control unit is configured to have a second low voltage output path between a second control terminal of the second switch and the grounding terminal be conductive or nonconductive according to the control voltage, the second control unit is configured to have a second high voltage output path between the second control terminal and the detection voltage input terminal be conductive or nonconductive according to the control voltage and the detection voltage, and the second control unit turns on the second switch when the second high voltage output path is conductive.

8. The ESD protection circuit of claim 6, wherein the protection circuit further includes:
- a first division voltage input terminal configured to receive a first division voltage from the detection circuit, in which the first division voltage is originated from the first voltage and the second voltage and different from the detection voltage; and
- a second division voltage input terminal configured to receive a second division voltage from the detection circuit, in which the second division voltage is originated from the first voltage and the second voltage and different from the detection voltage,
- wherein the first control unit is coupled between the first division voltage input terminal and the grounding terminal, the first control unit is configured to have a first low voltage output path between a first control terminal of the first switch and the grounding terminal be conductive or nonconductive according to the control voltage, the first control unit is configured to have a first high voltage output path between the first control terminal and the first division voltage input terminal be conductive or nonconductive according to the control voltage and the first division voltage, and the first control unit turns on the first switch when the first high voltage output path is conductive; the second control unit is coupled between the second division voltage input terminal and the grounding terminal, the second control unit is configured to have a second low voltage output path between a second control terminal of the second switch and the grounding terminal be conductive or nonconductive according to the control voltage, the second control unit is configured to have a second high voltage output path between the second control terminal and the second division voltage input terminal be conductive or nonconductive according to the control voltage and the second division voltage, and the second control unit turns on the second switch when the second high voltage output path is conductive.

9. The ESD protection circuit of claim 6, wherein the first switch includes a first transistor including a first parasitic diode; and the second switch includes a second transistor including a second parasitic diode.

10. The ESD protection circuit of claim 1, wherein the detection circuit includes:
a detection voltage output terminal coupled to the protection circuit and configured to output the detection voltage;
a first resistor coupled between the first terminal and the detection voltage output terminal; and
a second resistor coupled between the second terminal and the detection voltage output terminal.

11. The ESD protection circuit of claim 10, wherein the detection circuit further includes:
a first voltage dividing circuit coupled between the first terminal and the detection voltage output terminal and configured to supply a first division voltage to the protection circuit according to the first voltage and the second voltage, in which the first division voltage is different from the detection voltage; and
a second voltage dividing circuit coupled between the second terminal and the detection voltage output terminal and configured to supply a second division voltage to the protection circuit according to the first voltage and the second voltage, in which the second division voltage is different from the detection voltage, and the first division voltage and the second division voltage correlate with the predetermined threshold.

12. The ESD protection circuit of claim 1, wherein the detection circuit includes:
a detection voltage output terminal coupled to the protection circuit and configured to output the detection voltage;
a first voltage dividing circuit coupled between the first terminal and the detection voltage output terminal and configured to supply a first division voltage to the protection circuit according to the first voltage and the second voltage, in which the first division voltage is different from the detection voltage; and
a second voltage dividing circuit coupled between the second terminal and the detection voltage output terminal and configured to supply a second division voltage to the protection circuit according to the first voltage and the second voltage, in which the second division voltage is different from the detection voltage, and the first division voltage and the second division voltage correlate with the predetermined threshold.

13. The ESD protection circuit of claim 1, wherein the protection circuit includes:
a detection voltage input terminal coupled to the detection circuit and configured to receive the detection voltage;
a control voltage output terminal configured to output a control voltage;
a resistor coupled between the detection voltage input terminal and the control voltage output terminal;
an impedance coupled between the resistor and the grounding terminal;
a first switch coupled between the first terminal and the grounding terminal;
a second switch coupled between the second terminal and the grounding terminal;
a first control unit coupled between the control voltage output terminal and the first switch and configured to turn on or turn off the first switch according to the control voltage; and
a second control unit coupled between the control voltage output terminal and the second switch and configured to turn on or turn off the second switch according to the control voltage.

14. The ESD protection circuit of claim 13, wherein the first control unit is coupled between the detection voltage input terminal and the grounding terminal, the first control unit is configured to have a first low voltage output path between a first control terminal of the first switch and the grounding terminal be conductive or nonconductive according to the control voltage, the first control unit is configured to have a first high voltage output path between the first control terminal and the detection voltage input terminal be conductive or nonconductive according to the control voltage and the detection voltage, and the first control unit turns on the first switch when the first high voltage output path is conductive; the second control unit is coupled between the detection voltage input terminal and the grounding terminal, the second control unit is configured to have a second low voltage output path between a second control terminal of the second switch and the grounding terminal be conductive or nonconductive according to the control voltage, the second control unit is configured to have a second high voltage output path between the second control terminal and the detection voltage input terminal be conductive or nonconductive according to the control voltage and the detection voltage, and the second control unit turns on the second switch when the second high voltage output path is conductive.

15. The ESD protection circuit of claim 13, wherein the protection circuit further includes:
a first division voltage input terminal configured to receive a first division voltage from the detection circuit, in which the first division voltage is originated from the first voltage and the second voltage and different from the detection voltage; and
a second division voltage input terminal configured to receive a second division voltage from the detection circuit, in which the second division voltage is originated from the first voltage and the second voltage and different from the detection voltage,
wherein the first control unit is coupled between the first division voltage input terminal and the grounding terminal, the first control unit is configured to have a first low voltage output path between a first control terminal of the first switch and the grounding terminal be conductive or nonconductive according to the control voltage, the first control unit is configured to have a first high voltage output path between the first control terminal and the first division voltage input terminal be conductive or nonconductive according to the control voltage and the first division voltage, and the first control unit turns on the first switch when the first high voltage output path is conductive; the second control unit is coupled between the second division voltage input terminal and the grounding terminal, the second control unit is configured to have a second low voltage output path between a second control terminal of the second switch and the grounding terminal be conductive or nonconductive according to the control voltage, the second control unit is configured to have a second high voltage output path between the second control terminal and the second division voltage input terminal be conductive or nonconductive according to the control voltage and the second division voltage, and the second control unit turns on the second switch when the second high voltage output path is conductive.

16. The ESD protection circuit of claim 13, wherein the first switch includes a first transistor including a first parasitic diode; and the second switch includes a second transistor including a second parasitic diode.

* * * * *